(12) United States Patent
Wen et al.

(10) Patent No.: US 6,746,920 B1
(45) Date of Patent: Jun. 8, 2004

(54) FABRICATION METHOD OF FLASH MEMORY DEVICE WITH L-SHAPED FLOATING GATE

(75) Inventors: Wen-Ying Wen, Hsinchu (TW); Jyh-Long Horng, Hsinchu (TW)

(73) Assignee: Megawin Technology Co., Ltd., Hsinchu (TW)

( * ) Notice: Subject to any disclaimer, the term of this patent is extended or adjusted under 35 U.S.C. 154(b) by 0 days.

(21) Appl. No.: 10/337,330

(22) Filed: Jan. 7, 2003

(51) Int. Cl.$^7$ ............... H01L 21/336; H01L 21/3205; H01L 21/4763
(52) U.S. Cl. ............ 438/257; 438/257; 438/299; 438/286; 438/305; 438/266; 438/594
(58) Field of Search ................... 438/257, 299, 438/286, 305, 260, 266, 594, 264

(56) References Cited

U.S. PATENT DOCUMENTS

| | | | | |
|---|---|---|---|---|
| 5,268,319 A | * | 12/1993 | Harari | 438/260 |
| 5,427,968 A | * | 6/1995 | Hong | 438/264 |
| 5,541,132 A | * | 7/1996 | Davies et al. | 438/231 |
| 5,721,147 A | * | 2/1998 | Yoon | 438/367 |
| 5,811,853 A | * | 9/1998 | Wang | 257/316 |
| 6,066,534 A | * | 5/2000 | Son | 438/299 |
| 6,091,104 A | * | 7/2000 | Chen | 257/326 |
| 6,248,633 B1 | * | 6/2001 | Ogura et al. | 438/267 |
| 6,541,815 B1 | * | 4/2003 | Mandelman et al. | 257/315 |
| 6,632,745 B1 | * | 10/2003 | Yap et al. | 438/696 |

FOREIGN PATENT DOCUMENTS

JP         402007444 A    * 11/1990

\* cited by examiner

*Primary Examiner*—Matthew Smith
*Assistant Examiner*—Chuong A Luu
(74) *Attorney, Agent, or Firm*—Rosenberg, Klein & Lee

(57) ABSTRACT

The present invention generally relates to provide a fabrication method of a flash memory with L-shaped floating gate. The present invention utilizes a dielectric spacer on a surface of a semiconductor substrate to form a L-shaped poly spacer, which is so called the L-shaped floating gate. The respective inside portion of L-shaped floating gate is gibbous and to form a tip structure. Then, an isolating dielectric layer and a control gate are formed thereon. The control gate is covering the gibbous tip structure of the L-shaped floating gate to complete a flash memory device. The present invention is provided with a channel length, which is stably and easily controlled, and a tip structure for point discharging. Hence, the present invention can enhance the isolating effect between the control gate and the floating gate to achieve the purpose of repeating control the fabrication of the semiconductor devices.

10 Claims, 5 Drawing Sheets

FABRICATION METHOD OF FLASH MEMORY DEVICE WITH L-SHAPED FLOATING GATE

BACKGROUND OF THE INVENTION

1. Field of the Invention

The present invention generally relates to a fabrication method of a flash memory device, and more particularly relates to a fabrication method of the flash memory device having a L-shaped ploy spacer as a floating gate.

2. Description of the Prior Art

Accordingly, in the prior flash memory manufacture process, a spacer structure is usually formed on the semiconductor substrate and then the spacer structure is used to define the channel length. However, the prior fabrication method has difficult of controlling the spacer profile so as not to precisely control the implanted position of the source and the drain to cause the disadvantage of difficult of controlling the channel length.

On the other hand, in the conventional flash memory technology, the spacer could be also used as a floating gate, such as the U.S. Pat. No. 5,427,968 disclosed a fabrication method of split-gate flash memory cell with separated and self-aligned tunneling regions, referring to the FIG. 1A, FIG. 1B, FIG. 1C, and FIG. 1D. A semiconductor substrate 10 is provided and a gate oxide layer 12 and a silicon nitride layer 14 are formed on a surface of the semiconductor substrate 10, such as shown in the FIG. 1A. Using lithography technology defines a silicon nitride block 14 and removes the exposed portion of the gate oxide layer 12. A tunneling layer 16 and a floating gate 18 are sequentially formed on the semiconductor substrate 10. Utilizing a anisotropic etching technology forms a floating gate 18 of a ring-shaped poly spacer structure surrounding the silicon nitride block 14, such as shown in the FIG. 1B. A source 20 and a drain 22 are formed in the semiconductor substrate 10 by using the ion implantation. Then, the silicon nitride block 14 is removed and an isolating dielectric layer 24 is formed on the exposed portion of the floating gate 18 and the exposed surface of the semiconductor substrate 10, such as shown in the FIG. 1C. Following, a polysilicon layer is formed on the surface of the isolating dielectric layer 24 and then a control gate 26 is formed by etching to complete a flash memory device structure, such as shown in the FIG. 1D.

The fabrication method of the flash memory with the poly spacer as the floating gate mentioned above, it is difficult to control the profile and length of the spacer in the formulation of the spacer because of process parameters or device variation, so the channel length of the memory is difficult to control. The channel length of the flash memory formed in the early or late processes cannot repeatedly control.

Besides, owing to the operation method of the flash memory is depending on the technology of injecting or erasing the electric charge from the floating gate and the floating gate of the poly spacer requires a tip for point discharging in the data-erasing step. So, it utilizes the tunneling effect of the Fowler-Nordheim tunneling (F-N tunneling) technology to erase the electric charge as the base of data erasing. The floating gate formed by utilizing the U.S. Pat. No. 5,427,968 disclosed does not provide a good tip structure, so the point discharging effect is limited in the data-erasing step.

Obviously, the main spirit of the present invention is to provide a fabrication method of the flash memory device having a L-shaped ploy spacer as a floating gate, and then some disadvantages of well-known technology are overcome.

SUMMARY OF THE INVENTION

The primary object of the present invention is to provide a fabrication method of a flash memory device with a L-shaped poly spacer for using as a floating gate. The present invention can provide a channel length, which is stably and easily controlled, and a tip structure for point discharging. Hence, the present invention can enhance the isolating effect between the control gate and the floating gate to achieve the purpose of repeating control the fabrication of the semiconductor devices.

Another object of the present invention is to provide fabrication method of a flash memory device with a L-shaped floating gate, which can improve the ability of controlling the processes to form a semiconductor device with a good profile shape.

In order to achieve previous objects, the present invention provides a fabrication method of a flash memory device with a L-shaped floating gate. The fabrication method comprises the following steps. First, an oxide layer and a patterned first dielectric layer are formed on a surface of a semiconductor substrate. Then, a first polysilicon layer and a second dielectric layer are sequentially formed thereon and a anisotropic etching step is performed to etch the second dielectric layer to form a dielectric spacer at a gibbous portion of the first polysilicon layer. Next, the dielectric spacer is used as a mask to etch the first polysilicon layer to form a L-shaped floating gate. After removing the first dielectric layer, a source and a drain are formed in the semiconductor substrate. Then, an isolating dielectric layer and a control gate are sequentially formed on the semiconductor substrate so as to cover a gibbous portion of the L-shaped floating gate and to complete a flash memory device structure with a L-shaped floating gate.

Other advantages of the present invention will become apparent from the following description taken in conjunction with the accompanying drawings wherein are set forth, by way of illustration and an example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention is to disclose a fabrication method of a flash memory device with a L-shaped poly spacer for using as a floating gate. The present utilizes a dual dielectric spacer process to form a flash memory, such as the flash memory cell, provided with a L-shaped floating gate, so the length of the spacer could be controlled and fixed. Hence, the present invention can provide a channel length, which is stably and easily controlled, and a tip structure for point discharging. Hence, the present invention can enhance the isolating effect between the control gate and the floating gate to achieve the purpose of repeating control the fabrication of the semiconductor devices.

Figure 1A:
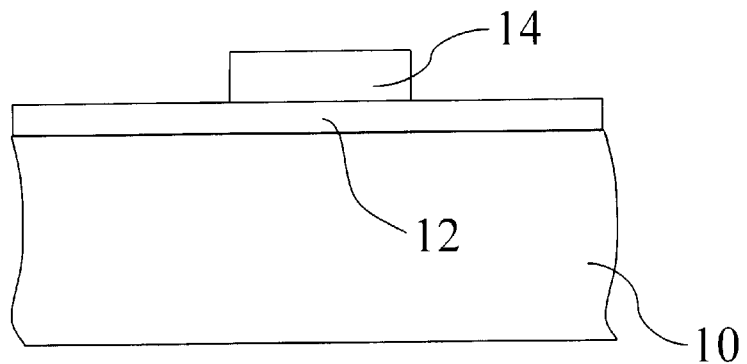
FIG. 1A and FIG. 1D are schematic representations structures at various stages during the formulation of the flash memory with a poly spacer for using as its floating gate, in accordance with the prior technology.
Figure 1B:
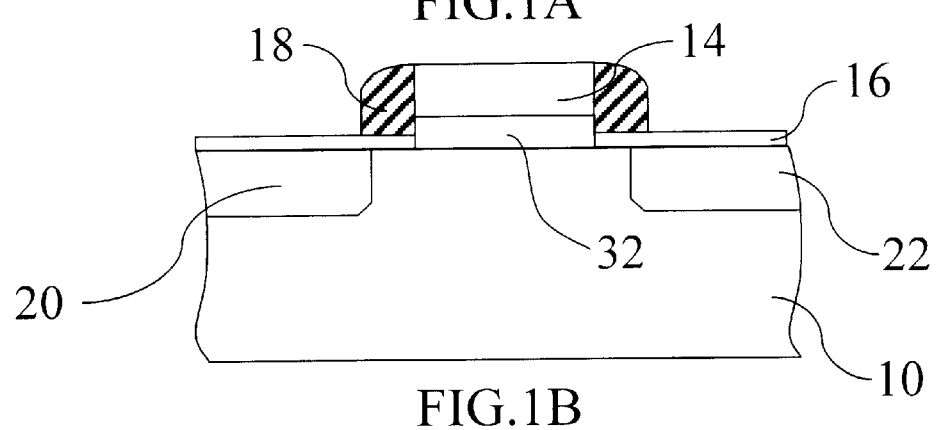
Figure 1C:
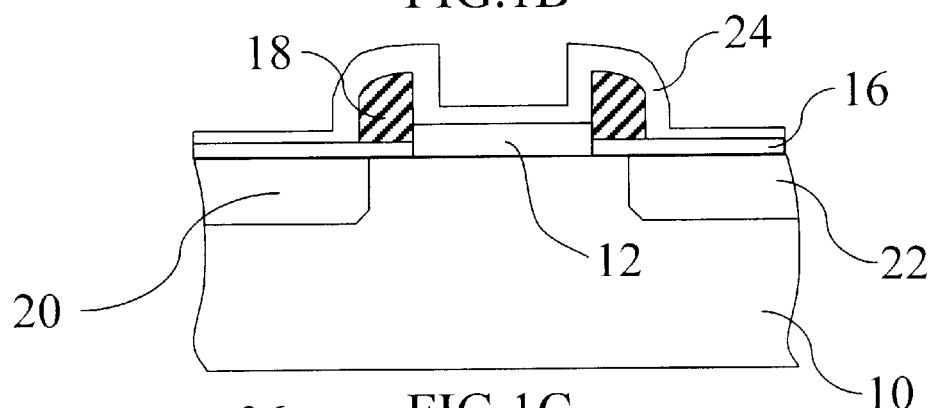
Figure 1D:
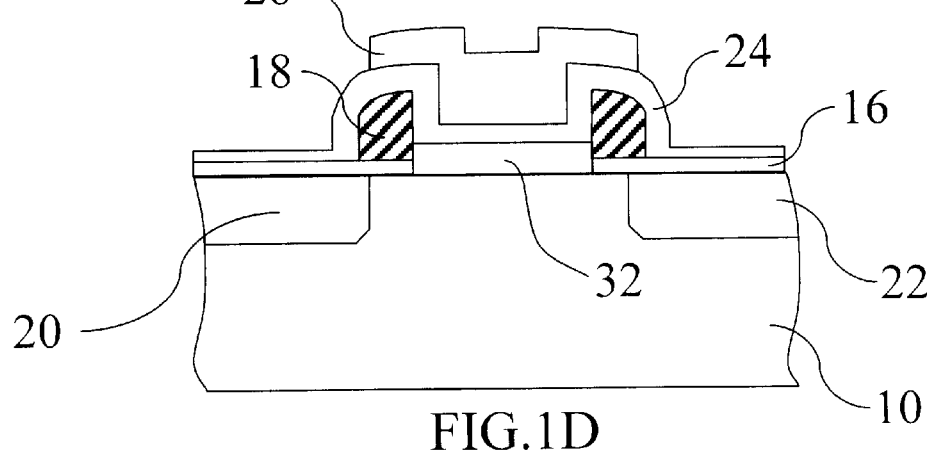
Figure 2A:
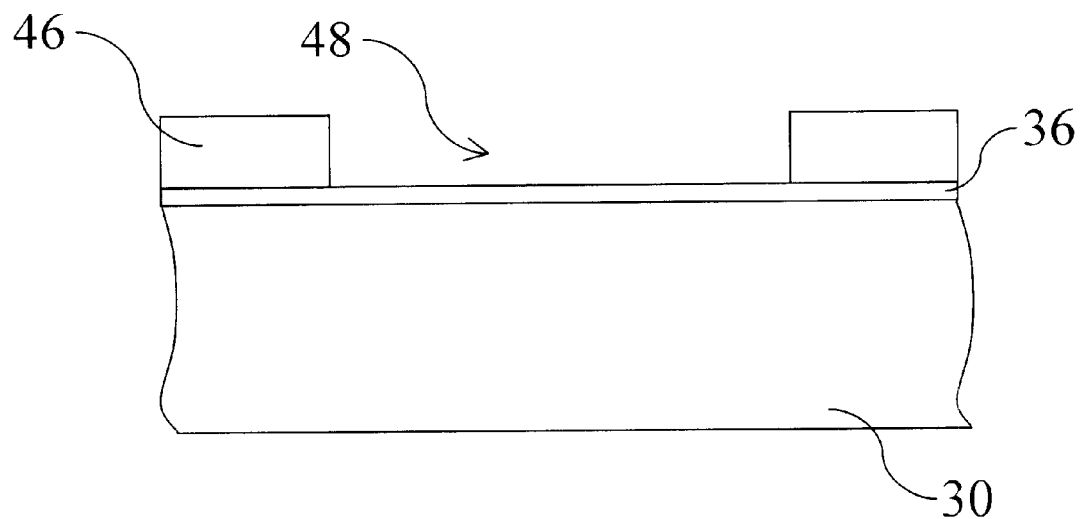
FIG. 2A and FIG. 2H are schematic representations structures at various stages during the formulation of the flash memory device with a L-shaped floating gate, in accordance with one preferred embodiment of the present invention.
Figure 2B:
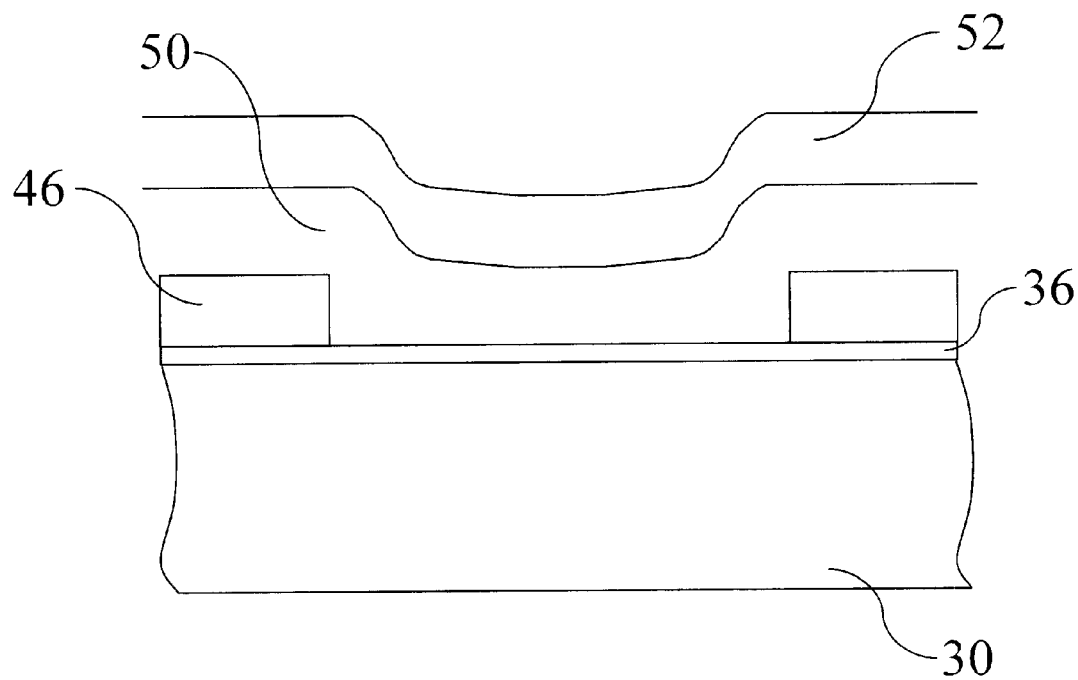
Figure 2C:
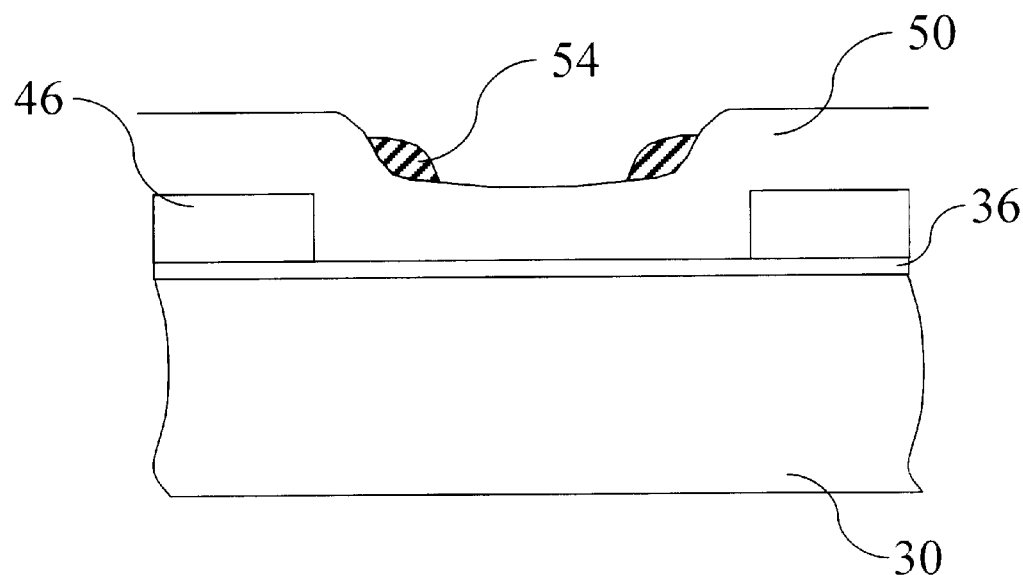
Figure 2D:
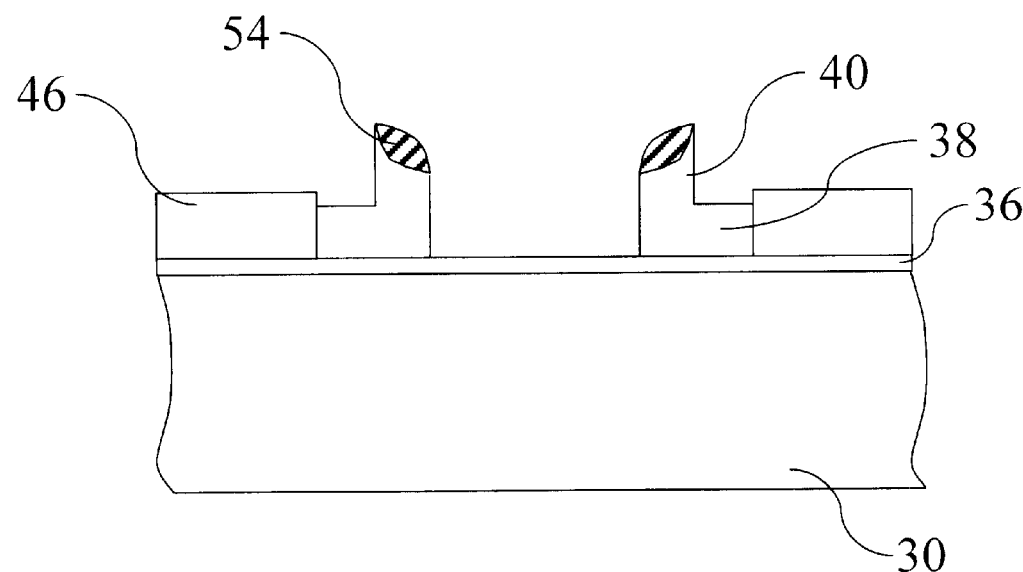
Figure 2E:
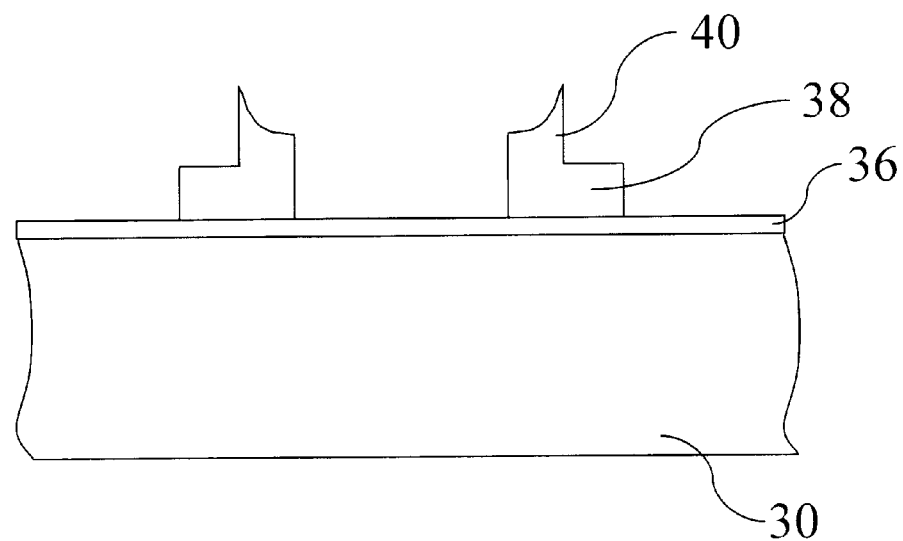
Figure 2F:
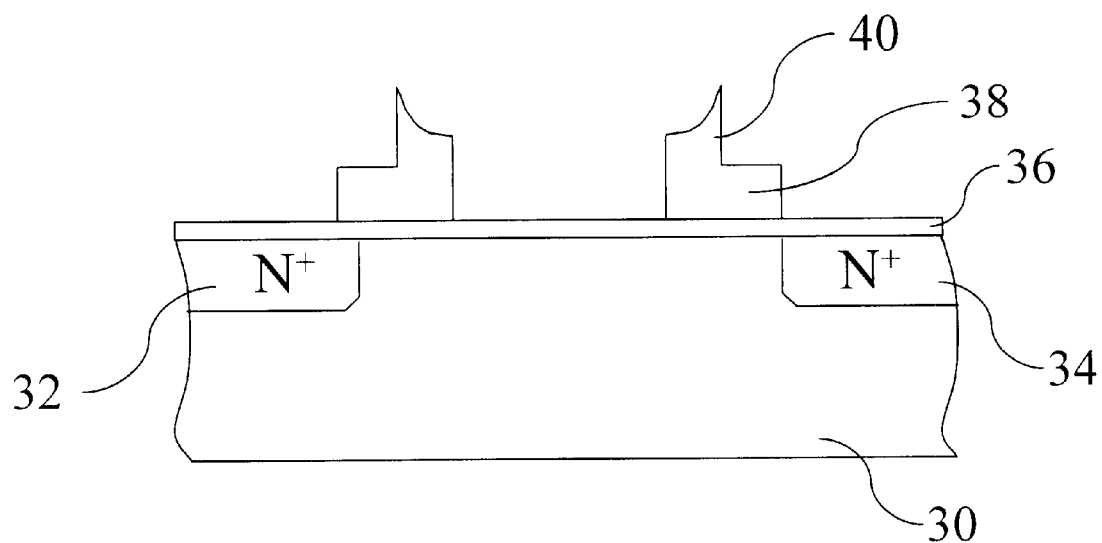
Figure 2G:
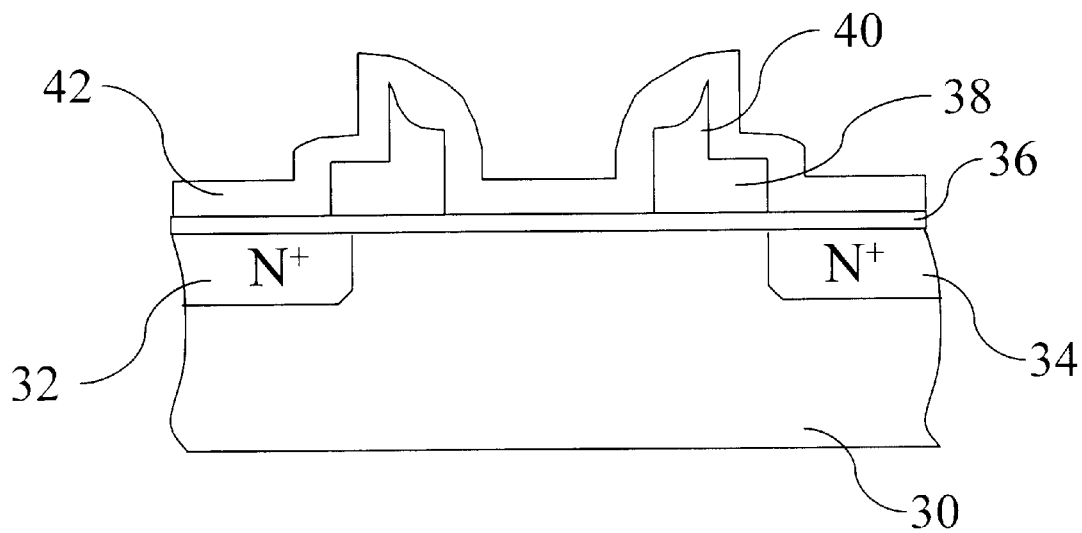
Figure 2H:
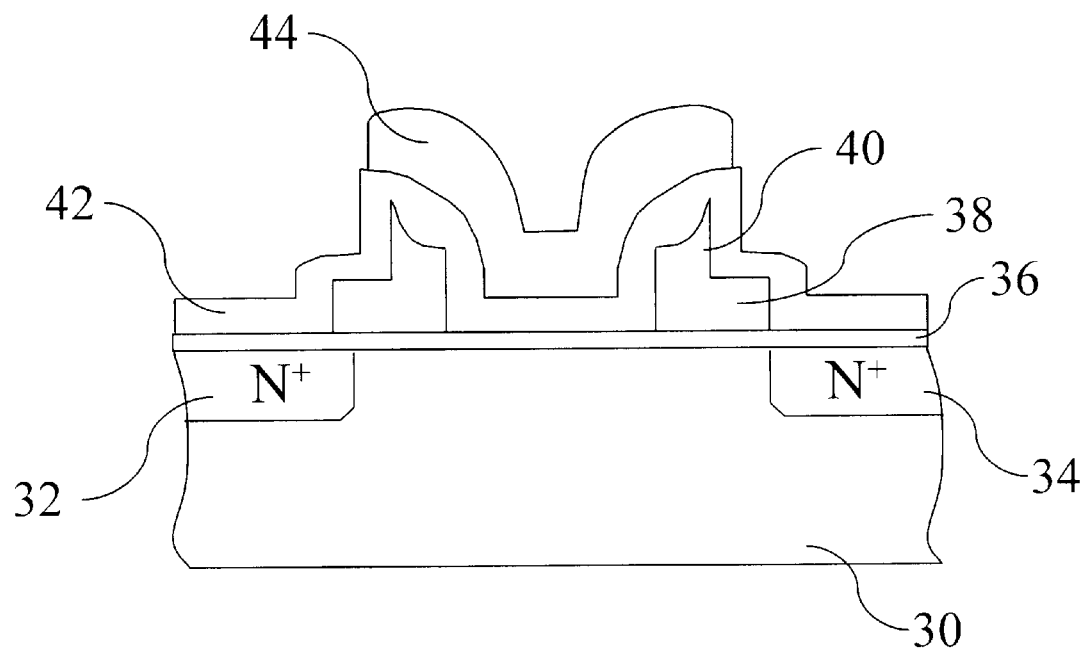

Referring to the FIG. 2A to the FIG. 2H, there are schematic representations structures at various stages to illustrate the fabrication of a flash memory device with a L-shaped floating gate of the preferred embodiment of the present invention in the foregoing. Such as shown in the figures, the fabrication method of the present invention includes the following steps.

First, such as shown in the FIG. 2A, a silicon semiconductor substrate 30 having a defined active region is provided and an oxide layer 36 is deposited grown thereon. Then, a lithography process is utilized to form a patterned first dielectric layer 46 on a surface of the oxide layer 36 by using a patterned photo resist layer as a mask and to expose the active region 48.

Following, such as shown in the FIG. 2B, a first polysilicon layer 50 and a second dielectric layer are sequentially deposited on the semiconductor substrate 30 to cover the active region 48 and the exposed surface of the first dielectric layer 46. Then, referring to the FIG. 2C, a anisotropic etching step is performed to etch the second dielectric layer 52. Owing to the portion of the first polysilicon layer 50 covering the first dielectric layer 46 is a little gibbously, so in the step of etching, most of the second dielectric layer 52 is removed to only remain partial dielectric material at the gibbous portion of the first dielectric layer 50 to form a dielectric spacer 54.

Next, the dielectric spacer 54 is used as a mask to etch the first polysilicon layer 50 by using the anisotropic etching process, so as a L-shaped poly spacer, such the L-shaped floating gate 38, such as shown in the FIG. 2D. Then, the dielectric spacer 54 and the first dielectric layer 46 are removed, such as shown in the FIG. 2E. The L-shaped floating gate 38 structure is obtained and the respective inside portion is formed is gibbous to form a tip structure 40.

After forming the L-shaped floating gate 38 (L-shaped poly spacer), the exposed portion of the semiconductor substrate 30 are implanted by using the ion implantation to form two N-type ion doped regions in the semiconductor substrate 30 for respectively using as a source 32 and a drain 34, such as shown in the FIG. 2F.

Referring to the FIG. 2G, an isolating dielectric layer 42 is deposited on the semiconductor substrate 30 to cover the L-shaped floating gate 38 and the exposed oxide layer 36. If the dielectric spacer 54 mention above is not removed, the dielectric spacer also can be compatible with the isolating dielectric layer 42, so the isolating dielectric layer 42 is directly deposited on the surface of the dielectric spacer 54.

Following, referring to the FIG. 2H, a second polysilicon layer is form on the surface of the isolating dielectric layer 42. Then, a patterned photo resist layer is used as a mask by utilizing the lithography technology to define the pattern of the second polysilicon layer to form a control gate 44. Hence, a memory cell structure of a flash memory device with the L-shaped floating gate is obtained.

Wherein, the first dielectric layer 46 and the second dielectric layer 52 mentioned above can be made of the same or different materials. The first dielectric layer 46 and the second dielectric layer 52 can be made of by selected from the group of the oxide, the nitride, and other dielectric materials. Besides, the present invention utilizes the oxide-nitride-oxide (ONO) layer or nitride-oxide (NO) layer with good dielectric characteristic, so the present invention can obtain better dielectric characteristic and thickness control. Furthermore, the isolating dielectric layer 42 can also be made of by selected from the group of the oxide, the nitride, and other dielectric materials.

However, the size of the dielectric spacer 54 formed by utilizing the present fabrication method may be different. Because end points of two external laterals of the L-shaped floating gate 38 (L-shaped poly spacer) are fixed, the external ends of the poly spacer are close and adjacent to the edge of the first dielectric layer 46 so as the length of the L-shaped floating gate 38 can be defined by using the dielectric spacer 54 can be controlled and fixed. Hence, the present invention can form a channel length, which is stably and easily controlled. Furthermore, the control gate is completely covering the sharp profile 40 of the gibbous portion of the L-shaped floating gate 38, so the present invention can enhance the isolation effect between the control gate and the floating gate. In the point discharging of the Fowler-Nordheim tunneling (F-N tunneling), the sharp profile 40 of the gibbous portion of the L-shaped floating gate 38 is very sharp in the top end so as to provide a better effect of centralizing the electric field to obtain a better effect of point discharging. Hence, the flash memory device formed by utilizing the present fabrication method can achieve the effect of repeating control the semiconductor manufacture.

Of course, it is to be understood that the invention described herein need not be limited to these disclosed embodiments. Various modification and similar changes are still possible within the spirit of this invention. In this way, all such variations and modifications are included within the intended scope of the invention and the scope of this invention should be defined by the appended claims.

What is claimed is:

1. A fabrication method of a flash memory with a L-shaped floating gate, said fabrication method including the following steps:

provoding a semiconductor substrate having a defined active region, wherein further comprising an oxide layer deposited on a surface of said semiconductor substrate;

forming a patterned first dielectric layer on said oxide layer to expose said active region;

depositing a first polysilicon layer on said semiconductor substrate to cover said active region and said first dielectric layer;

depositing a second dielectric layer on a surface of said first dielectric layer;

performing an anisotropic etching step to etch said second dielectric layer to form a dielectric spacer at a gibbous portion of said first dielectric layer;

using said dielectric spacer as a mask to etch said first polysilicon layer to form a L-shaped poly spacer in said active region between said first dielectric layer for use as a floating gate and then removing said first dielectric layer;

performing ion implantation to said semiconductor substrate to form a source and a drain of ion doped regions;

depositing an isolating dielectric layer on said semiconductor substrate to cover said L-shaped poly spacer and said oxide layer; and forming a defined second polysilicon layer on said isolating layer for use as a control gate, wherein said second polysilicon layer is covering a gibbous portion of said L-shaped poly spacer.

2. The fabrication method according to claim 1, wherein said first dielectric layer is selected from the group of an oxide, a nitride, and other dielectric materials.

3. The fabrication method according to claim 1, wherein said second dielectric layer is selected from the group of an oxide, a nitride, and other dielectric materials.

4. The fabrication method according to claim 1, wherein using a patterned photo resist layer as a mask forms said patterned first dielectric layer.

5. The fabrication method according to claim 1, wherein said isolating dielectric layer is a dielectric layer structure of oxide-nitride-oxide (ONO) or nitride-oxide (NO).

6. The fabrication method according to claim 1, wherein said isolating dielectric layer is selected from the group of an oxide, a nitride, and other dielectric materials.

7. The fabrication method according to claim 1, wherein the step of etching said first polysilicon layer is an anisotropic etching process.

8. The fabrication method according to claim 1, wherein using a patterned photo resist layer as a mask forms said defined second polysilicon layer.

9. The fabrication method according to claim 1, wherein said ion doped regions are N-type doped regions.

10. The fabrication method according to claim 1, wherein the step of removing said first dielectric layer could simultaneously remove said dielectric spacer.

* * * * *